United States Patent
Ebrish et al.

(10) Patent No.: US 9,666,486 B1
(45) Date of Patent: May 30, 2017

(54) CONTAINED PUNCH THROUGH STOPPER FOR CMOS STRUCTURES ON A STRAIN RELAXED BUFFER SUBSTRATE

(71) Applicant: International Business Machines Corporation, Armonk, NY (US)

(72) Inventors: Mona A. Ebrish, Albany, NY (US); Hemanth Jagannathan, Niskayuna, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/158,196

(22) Filed: May 18, 2016

(51) Int. Cl.
| | | |
|---|---|---|
| *H01L 29/00* | (2006.01) | |
| *H01L 21/8238* | (2006.01) | |
| *H01L 29/10* | (2006.01) | |
| *H01L 29/16* | (2006.01) | |
| *H01L 29/161* | (2006.01) | |
| *H01L 29/167* | (2006.01) | |
| *H01L 27/092* | (2006.01) | |
| *H01L 29/06* | (2006.01) | |
| *H01L 29/66* | (2006.01) | |

(Continued)

(52) U.S. Cl.
CPC .. *H01L 21/823807* (2013.01); *H01L 21/0245* (2013.01); *H01L 21/02381* (2013.01); *H01L 21/02532* (2013.01); *H01L 21/823821* (2013.01); *H01L 21/823892* (2013.01); *H01L 27/0924* (2013.01); *H01L 27/0928* (2013.01); *H01L 29/0638* (2013.01); *H01L 29/1054* (2013.01); *H01L 29/16* (2013.01); *H01L 29/161* (2013.01); *H01L 29/167* (2013.01); *H01L 29/66537* (2013.01); *H01L 29/66545* (2013.01); *H01L 29/785* (2013.01)

(58) Field of Classification Search
CPC .......... H01L 29/1054; H01L 21/02532; H01L 21/02381; H01L 21/0245; H01L 29/785
See application file for complete search history.

(56) References Cited

U.S. PATENT DOCUMENTS

| | | |
|---|---|---|
| 6,190,975 B1 | 2/2001 | Kubo et al. |
| 6,906,400 B2 | 6/2005 | Delhougne et al. |

(Continued)

FOREIGN PATENT DOCUMENTS

WO 2009141757 A1 11/2009

*Primary Examiner* — Ngan Ngo
(74) *Attorney, Agent, or Firm* — Scully, Scott, Murphy & Presser, P.C.; Daniel P. Morris, Esq.

(57) ABSTRACT

A semiconductor structure is provided in which the diffusion of arsenic is retarded. The structure includes a strain relaxed silicon germanium alloy buffer layer located on a surface of a silicon substrate. A boron-containing p-well region is located in a first region of a carbon doped silicon germanium alloy layer and on a first portion of the strain relaxed silicon germanium alloy buffer layer, and a phosphorus-containing n-well region is located in a second region of the carbon doped silicon germanium alloy layer and on a second portion of the strain relaxed silicon germanium alloy buffer layer. A tensily strained silicon material is located on a surface of the p-well region, and a compressively strained germanium-containing material is located on a surface of the n-well region.

20 Claims, 5 Drawing Sheets

(51) Int. Cl.
*H01L 29/78* (2006.01)
*H01L 21/02* (2006.01)

(56) References Cited

U.S. PATENT DOCUMENTS

| | | | |
|---|---|---|---|
| 7,256,142 B2 * | 8/2007 | Fitzgerald | H01L 21/02381 257/E21.129 |
| 7,594,967 B2 * | 9/2009 | Vineis | H01L 21/02381 117/101 |
| 8,669,590 B2 | 3/2014 | Sanchez et al. | |
| 8,951,870 B2 | 2/2015 | Basker et al. | |
| 8,957,477 B2 | 2/2015 | Chang et al. | |
| 2002/0089032 A1 * | 7/2002 | Huang | H01L 21/76243 257/507 |
| 2006/0157732 A1 | 7/2006 | Von Kaenel et al. | |
| 2014/0252479 A1 * | 9/2014 | Utomo | H01L 29/785 257/347 |
| 2014/0377926 A1 | 12/2014 | Kim et al. | |

\* cited by examiner

CONTAINED PUNCH THROUGH STOPPER FOR CMOS STRUCTURES ON A STRAIN RELAXED BUFFER SUBSTRATE

BACKGROUND

The present application relates to a semiconductor structure and a method of forming the same. More particularly, the present application relates to a semiconductor structure that includes a carbon-doped silicon germanium alloy layer as a punch through stopper that is located above a strain relaxed silicon germanium alloy buffer layer.

Strain relaxed buffer (SRB) layers are needed for strained channel complementary metal oxide semiconductor (CMOS) devices. As an example, a silicon germanium alloy (i.e., SiGe) SRB layer is used for growing tensily strained silicon (Si) channels for n-channel field effect transistors (i.e., nFETs), and compressively strained germanium or high-germanium percentage SiGe channels for p-channel field effect transistors (i.e., pFETs).

One major problem with using a SiGe material is the fast diffusion of n-doped species used to form well implants for pFETs. Arsenic has a much higher diffusion rate in a SiGe alloy than in silicon, leading to unwanted lateral diffusion of arsenic into the p-well region and/or upward into the pFET channel region during thermal processing, destroying the devices. Phosphorus diffuses a little less, but the problem remains the same. There is thus a need in the semiconductor industry for a method and structure that obviates the problem of fast dopant diffusion within a substrate including a strain relaxed silicon germanium alloy buffer layer.

SUMMARY

In one aspect of the present application, a semiconductor structure is provided. In one embodiment of the present application, the semiconductor structure may include a substrate including a strain relaxed silicon germanium alloy buffer layer located on a surface of a silicon substrate. A boron-containing p-well region is located in a first region of a carbon doped silicon germanium alloy layer and on a first portion of the strain relaxed silicon germanium alloy buffer layer, and a phosphorus-containing n-well region is located in a second region of the carbon doped silicon germanium alloy layer and on a second portion of the strain relaxed silicon germanium alloy buffer layer. A tensily strained silicon material is located on a surface of the boron-containing p-well region, and a compressively strained germanium-containing material is located on a surface of the phosphorus-containing n-well region.

In another aspect of the present application, a method of forming a semiconductor structure is provided. In one embodiment of the present application, the method may include forming a substrate including a strain relaxed silicon germanium alloy buffer layer on a surface of a silicon substrate. Next, a carbon doped silicon germanium alloy layer is formed on a surface of the strain relaxed silicon germanium alloy buffer layer. A boron-containing p-well region is formed in a first region of the carbon doped silicon germanium alloy layer, and a phosphorus-containing n-well region is formed in a second region of the carbon doped silicon germanium alloy layer. Next, a tensily strained silicon material is formed on a surface of the boron-containing p-well region, and a compressively strained germanium-containing material is formed on a surface of the phosphorus-containing n-well region.

DETAILED DESCRIPTION

Figure 1:
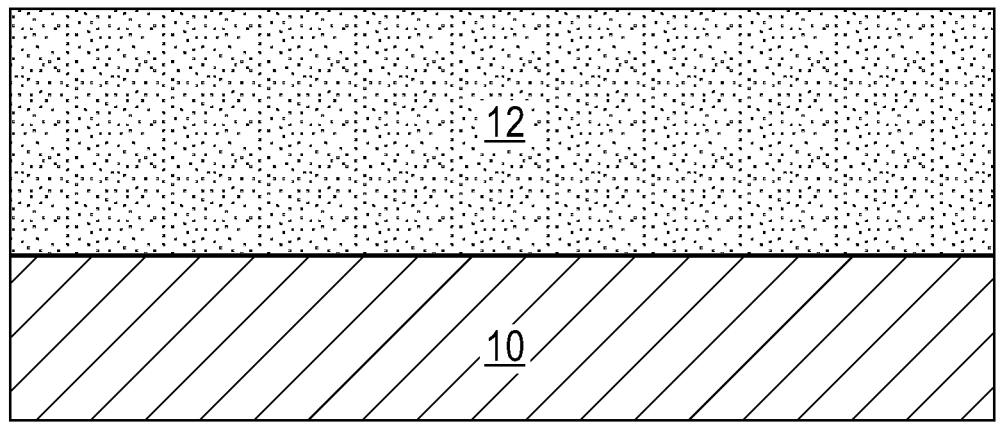
FIG. 1 is a cross sectional view of an exemplary semiconductor structure including a substrate containing, from bottom to top, a silicon substrate and a strain relaxed silicon germanium alloy buffer layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including, from bottom to top, a silicon substrate 10 and a strain relaxed silicon germanium alloy buffer layer 12 that can be employed in accordance with an embodiment of the present application. Collectively, the silicon substrate 10 and the strain relaxed silicon germanium alloy buffer layer 12 provide a substrate (i.e., an SRB substrate) of the present application.

The silicon substrate 10 that can be employed in the present application may be a single crystalline semiconductor material. The silicon substrate 10 may have any of the well known crystal orientations. For example, the crystal orientation of the silicon substrate 10 may be {100}, {110}, or {111}. Other crystallographic orientations besides those specifically mentioned can also be used in the present application.

The strain relaxed silicon germanium alloy buffer layer 12 may include a germanium content of from 15 atomic percent germanium to 30 atomic percent germanium. Other germanium contents that are lesser than 15 atomic percent germanium, or greater than 30 atomic percent germanium, can also be used for the strain relaxed silicon germanium alloy buffer layer 12. In one embodiment of the present application, the strain relaxed silicon germanium alloy buffer layer 12 has a graded germanium content in which the germanium content increases upward from silicon substrate 10. In such an embodiment, the strain relaxed silicon germanium alloy buffer layer 12 may have a germanium content within an uppermost portion that is from 20 atomic percent to 25 atomic percent. The strain relaxed silicon germanium alloy buffer layer 12 has a lattice constant that differs from the lattice constant of the silicon substrate 10. The strain may be tensile or compressive.

The strain relaxed silicon germanium alloy buffer layer 12 is a blanket layer that covers an entirety of the surface of the silicon substrate 10. The silicon germanium alloy material that provides the strain relaxed silicon germanium alloy buffer layer 12 can be formed by an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the strain relaxed silicon germanium alloy buffer layer 12 thus has an epitaxial relationship with the surface of the silicon substrate 10.

Examples of various epitaxial growth process apparatuses that are suitable for use in forming the silicon germanium alloy that provides the strain relaxed silicon germanium alloy buffer layer 12 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 1150° C.

A number of different sources may be used for the deposition of the silicon germanium alloy that provides the strain relaxed silicon germanium alloy buffer layer 12. In some embodiments, the source gas may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, silicon tetrachloride and combinations thereof. Examples of germanium gas sources include germane, digermane, halogermane, dichlorogermane, trichlorogermane, tetrachlorogermane and combinations thereof. In some embodiments, the silicon germanium alloy that provides the strain relaxed silicon germanium alloy buffer layer 12 can be formed from a source gas that includes a compound containing silicon and germanium. Other source gases or gases mixtures that are known to those skilled in the art can also be used in forming the silicon germanium alloy that provides the strain relaxed silicon germanium alloy buffer layer 12. Carrier gases like hydrogen, nitrogen, helium and argon can be used.

In accordance with the present application, the thickness of the silicon germanium alloy that provides the strain relaxed silicon germanium alloy buffer layer 12 is above the critical thickness of the deposited silicon germanium alloy such that the deposited strained silicon germanium alloy relaxes to provide the strain relaxed silicon germanium alloy buffer layer 12. Above the critical thickness, defects form to partially relieve the strain in the silicon germanium alloy. In one embodiment, the strain relaxed silicon germanium alloy buffer layer 12 has a thickness that is greater than 2 micrometers.

Figure 2:
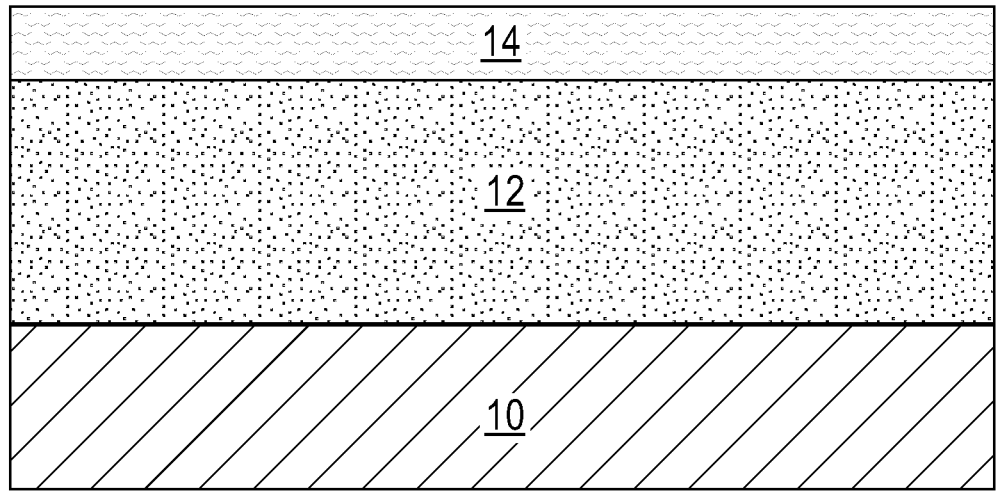
FIG. 2 is a cross sectional view of the exemplary semiconductor structure of FIG. 1 after forming a silicon germanium alloy layer that is doped with carbon on an exposed topmost surface of the strain relaxed silicon germanium alloy buffer layer.

Referring now to FIG. 2, there is illustrated the exemplary semiconductor structure of FIG. 1 after forming a silicon germanium alloy layer that is doped with carbon (i.e., a carbon doped silicon germanium alloy (SiGe:C) layer 14) on an exposed topmost surface of the strain relaxed silicon germanium alloy buffer layer 12.

The carbon doped silicon germanium alloy (SiGe:C) layer 14 is a continuous layer that covers the entirety of the underlying strain relaxed silicon germanium alloy buffer layer 12. The carbon doped silicon germanium alloy (SiGe: C) layer 14 can be formed utilizing an epitaxial growth process as mentioned. A C dopant such as, for example, monomethylsilane may be introduced into the precursor gas mixture used to form a silicon germanium alloy. The carbon doped silicon germanium alloy (SiGe:C) layer 14 can have a C dopant content that is from 1E18 atoms/cm$^3$ to 1E 21 atoms/cm$^3$.

The carbon doped silicon germanium alloy (SiGe:C) layer 14 is latticed matched to the underlying strain relaxed silicon germanium alloy buffer layer 12. Moreover, the carbon doped silicon germanium alloy (SiGe:C) layer 14 has a germanium content that is greater than the germanium content within an uppermost portion of the strain relaxed buffer layer. For example, and in one embodiment, the carbon doped silicon germanium alloy (SiGe:C) layer 14 may have a germanium content of 21 to about 22 atomic percent, while the uppermost portion of the strain relaxed silicon germanium alloy buffer layer may have a germanium content of 20 atomic percent.

In accordance with the present application, the carbon doped silicon germanium alloy (SiGe:C) layer 14 has a same strain value as that of the underlying strain relaxed silicon germanium alloy buffer layer 12 due to the stain compensation of the carbon atoms within the carbon doped silicon germanium alloy (SiGe:C) layer 14.

In one embodiment of the present application, the thickness of the carbon doped silicon germanium alloy (SiGe:C) layer 14 may be from 50 nm to 300 nm. Other thicknesses for the carbon doped silicon germanium alloy (SiGe:C) layer 14 are possible and are thus not excluded from the present application.

Figure 3:
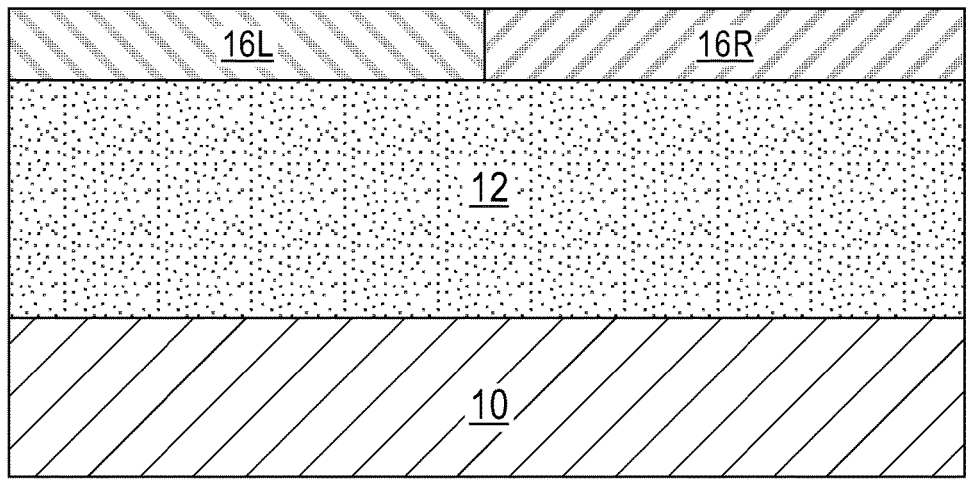
FIG. 3 is a cross sectional view of the exemplary semiconductor structure of FIG. 2 after forming, in any order, a boron-containing p-well region in a first region of the silicon germanium alloy layer that is doped with carbon, and a phosphorus-containing n-well region in a second region of the silicon germanium alloy layer that is doped with carbon.

Referring now to FIG. 3, there is illustrated the exemplary semiconductor structure of FIG. 2 after forming, in any order, a boron-containing p-well region 16L in a first region of the carbon doped silicon germanium alloy layer 14, and a phosphorus-containing n-well region 16R in a second region of the carbon doped silicon germanium alloy layer 14. In this embodiment, the phosphorus-containing n-well region 16R is void of arsenic and/or antimony. As is shown, a sidewall surface of the boron-containing p-well region 16L is in direct physical contact with a sidewall surface of the phosphorus-containing n-well region 16R.

In accordance with the present application, the boron p-well region 16L includes boron incorporated into the first region of the carbon doped silicon germanium alloy layer 14, while the phosphorus-containing n-well region 16R includes phosphorus incorporated into the second region of the carbon doped silicon germanium alloy layer 14. In this embodiment of the present application, boron and phosphorus diffusion is retarded since boron and phosphorus diffuse via vacancies. Carbon within the carbon doped silicon germanium alloy layer 14 takes up those vacancies and those retards the diffusion of boron and phosphorus.

In some embodiments, the boron-containing p-well region 16L is formed prior to forming the phosphorus-containing n-well region 16R. In such an embodiment, a block mask is formed over the second region of the carbon doped silicon germanium alloy layer 14, while leaving the first region of the carbon doped silicon germanium alloy layer 14 exposed. The block mask may include a photoresist, a hard mask material or a material stack of, from bottom to top, a hard mask material, and a photoresist. The block mask can be formed utilizing techniques well known in the art. Boron is then implanted into the exposed first region of the carbon doped silicon germanium alloy layer 14 with the block mask in place utilizing ion implantation conditions that are well known to those skilled in the art. A diffusion anneal may follow the ion implantation of boron into the first region of the carbon doped silicon germanium alloy layer 14. After boron incorporation, the block mask located over the second region is removed and then another block mask is formed over the first region that now contains the boron-containing p-well region 16L. Phosphorus is then implanted into the exposed second region of the carbon doped silicon germanium alloy layer 14 with the another block mask in place utilizing ion implantation conditions that are well known to those skilled in the art. A diffusion anneal may follow the ion implantation of phosphorus into the second region of the carbon doped silicon germanium alloy layer 14. In some embodiments, a single diffusion anneal is used after introducing boron and phosphorus into the respective regions of the carbon doped silicon germanium alloy layer 14. The another block mask is removed after the introduction of phosphorus into the second region of the carbon doped silicon germanium alloy layer 14.

In some embodiments, the phosphorus-containing n-well region 16R is formed prior to forming the boron-containing p-well region 16L. In such an embodiment, the above steps of block mask formation and ion implantation is reversed.

In either embodiment, the boron-containing p-well region 16L may contain boron in a concentration of from $1\times10^{18}$ atoms/cm$^3$ to $1\times10^{19}$ atoms/cm$^3$, while the phosphorus-containing n-well region 16R may contain phosphorus in a concentration of from $1\times10^{18}$ atoms/cm$^3$ to $1\times10^{19}$ atoms/cm$^3$.

Figure 4:
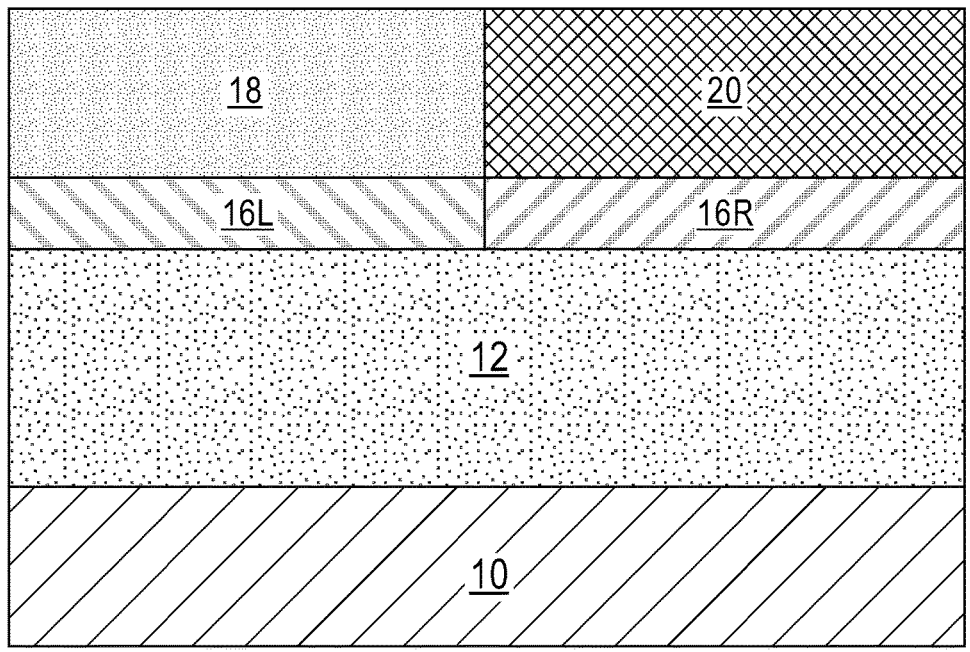
FIG. 4 is a cross sectional view of the exemplary semiconductor structure of FIG. 3 after forming, in any order, a tensily strained silicon layer on the boron-containing p-well region, and a compressively strained germanium-containing material layer on the phosphorus-containing n-well region.

Referring now to FIG. 4, there is illustrated the exemplary semiconductor structure of FIG. 3 after forming, in any order, a tensily strained silicon material 18 on the boron-containing p-well region 16L, and a compressively strained germanium-containing material 20 on the phosphorus-containing n-well region 16R.

In one embodiment of the present application, the tensily strained silicon material 18 is formed prior to forming the compressively strained germanium-containing material 20. In such an embodiment, a block mask as defined above is formed over the phosphorus-containing n-well region 16R utilizing conventional techniques well known to those skilled in the art. With the block mask in place, the tensily strained silicon material 18 can be formed over the boron-containing p-well region 16L. The tensily strained silicon material 18 can be formed utilizing an epitaxial growth (deposition) process as mentioned above employing a silicon-containing precursor(s) that is (are) well known to those skilled in the art. The tensily strained silicon material 18 may have a deposited thickness of from 50 nm to 250 nm. Next, and after epitaxial growth of the tensily strained silicon material 18, the block mask is removed and then another block mask is formed over the tensily strained silicon material 18. The compressively strained germanium-containing material 20 formed is then over the phosphorus-containing n-well region 16R utilizing an epitaxial growth (deposition) process as mentioned above employing a germanium-containing precursor(s) that is (are) well known to those skilled in the art. In one embodiment, the compressively strained germanium-containing material 20 contains pure (i.e., unalloyed) germanium. In another embodiment, the compressively strained germanium-containing material 20 comprises a silicon germanium alloy having a higher germanium content than the strain relaxed silicon germanium alloy buffer layer. In some embodiments, the compressively strained germanium-containing material 20 has a germanium content from 30 atomic percent to 50 atomic percent. The compressively strained germanium-containing material 20 may have a deposited thickness of from 50 nm to 250 nm. Next, and after epitaxial growth of the compressively strained germanium-containing material 20, the another block mask is removed. In some embodiments, the compressively strained germanium-containing material 20 has a same thickness as the tensily strained silicon material 18; in such an embodiment, the topmost surfaces of the compressively strained germanium-containing material 20 and the tensily strained silicon material 18 are coplanar with each other. In other embodiments, the compressively strained germanium-containing material 20 has a different thickness than the tensily strained silicon material 18; in such an embodiment, the topmost surface of the compressively strained germanium-containing material 20 is vertically offset from a topmost surface of the tensily strained silicon material 18. In such an embodiment, a planarization process can be removed to remove the offset.

In some embodiments, the tensily strained silicon material 18 is formed after forming the compressively strained germanium-containing material 20. In this embodiment, the order of block mask formation and epitaxial growth as mentioned above can be reversed.

Notably, FIG. 4 (and FIGS. 5-6 to follow) illustrates a semiconductor structure of the present application in which the diffusion of arsenic is retarded. The structure includes a strain relaxed silicon germanium alloy buffer layer 12 located on a surface of a silicon substrate 10. A p-well region 16L is located in a first region of a carbon doped silicon germanium alloy layer 14 and on a first portion of the strain relaxed silicon germanium alloy buffer layer 12, and a phosphorus-containing n-well region 16R is located is located in a second region of the carbon doped silicon germanium alloy layer 14 and on a second portion of the strain relaxed silicon germanium alloy buffer layer 12. A tensily strained silicon material 18 is located on a surface of the p-well region 16L, and a compressively strained germanium-containing material 20 is located on a surface of the phosphorus-containing n-well region 16R.

Figure 5:
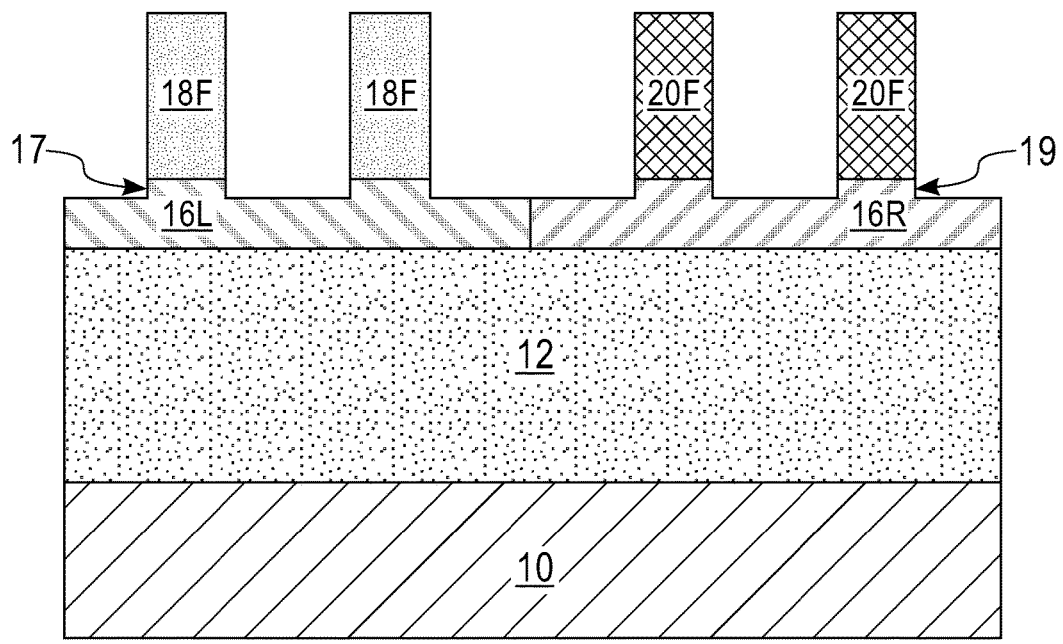
FIG. 5 is a cross sectional view of the exemplary semiconductor structure of FIG. 4 after patterning the tensily strained silicon layer and the compressively strained germanium-containing material layer to provide at least one tensily strained silicon fin and at least one compressively strained germanium-containing material fin, respectively.

Referring now to FIG. 5, there is illustrated the exemplary semiconductor structure of FIG. 4 after patterning the tensily strained silicon material 18 and the compressively strained germanium-containing material 20 to provide at least one tensily strained silicon fin 18F and at least one compressively strained germanium-containing material fin 20F, respectively.

In one embodiment, the patterning process used to define the at least one tensily strained silicon fin 18F and the at least one compressively strained germanium-containing material fin 20F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer which can be composed of any material that has a different etch selectivity than the mandrel material can be formed by deposition of a spacer material and then etching the deposited spacer material. In one example, the spacer material may be composed of any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet another embodiment, the patterning process may include a direct self-assembly (DSA) patterning process.

As used herein, a "fin" refers to a contiguous semiconductor material, and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin (18F, 20F) may have a width from 4 nm to 30 nm; the height of each semiconductor fin (18F, 20F) may be from 10 nm to 150 nm. Other widths and heights that are lesser than, or greater than the ranges mentioned herein can also be used in the present application.

In some embodiments of the present application, and as shown, the etch used to define the semiconductor fins (18F, 20F) may remove exposed portions of the boron-containing p-well region 16L and phosphorus-containing n-well region 16R. As is shown, each tensily strained silicon fin 18F is located on a mesa portion 17 of the boron-containing p-well region 16L, and each compressively strained germanium-containing material fin 20F is located on a mesa portion 19 of the phosphorus-containing n-well region 16R. By "mesa portion" it is meant a portion of a continuous material layer that has a higher surface than the remaining portion of the continuous material layer.

Figure 6:
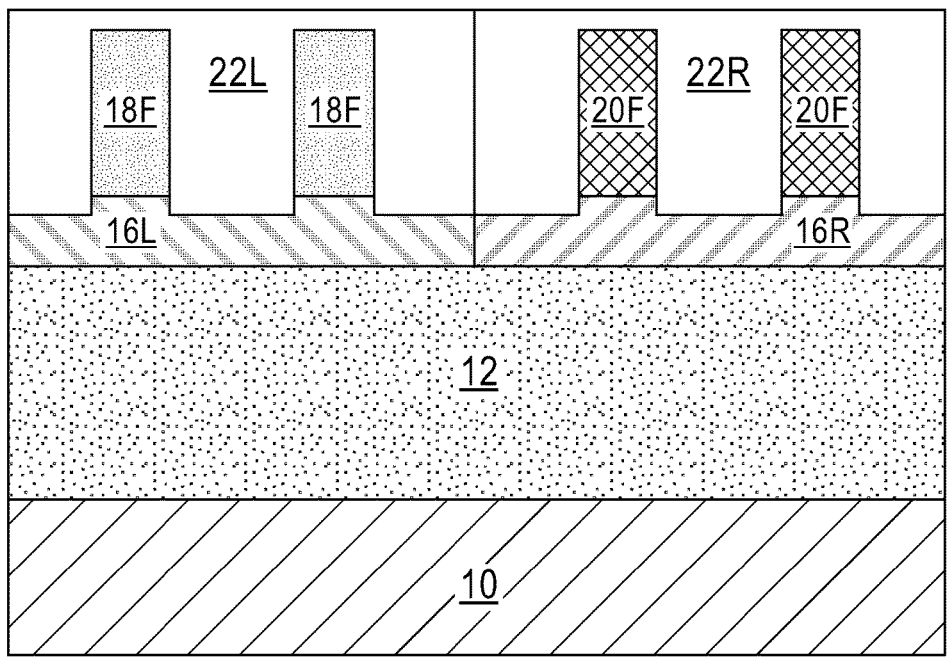
FIG. 6 is a cross sectional view of the exemplary semiconductor structure of FIG. 5 after forming a first functional gate structure straddling the at least one tensily strained silicon fin, and a second functional gate structure straddling the at least one compressively strained germanium-containing material fin.

Referring now to FIG. 6, there is illustrated the exemplary semiconductor structure of FIG. 5 after forming a first functional gate structure 22L straddling the at least one tensily strained silicon fin 18F, and a second functional gate structure 22R straddling the at least one compressively strained germanium-containing material fin 20F.

Although the present application describes and illustrates the formation of a single first functional gate structure 22L and a second single functional gate structure 22R, a plurality of first functional gate structures can be formed straddling different portions of each tensily strained silicon fin 18F and/or a plurality of second functional gate structures can be formed straddling different portions of each compressively strained germanium-containing material fin 20F. In some embodiments, the first and second functional gate structures may be a single functional gate structure that straddles a portion of each tensily strained silicon fin 18F and each compressively strained germanium-containing material fin 20F.

The term "straddling" denotes that the functional gate structure is formed across a semiconductor material fin such that a first portion of each functional gate structure is present on one side of the semiconductor material fin and a second portion of each functional gate structure is present on another side of the semiconductor material fin. Also, a portion of the functional gate structure is also located on a topmost surface of a portion of semiconductor material fin.

By "functional gate structure" it is meant a permanent gate structure used to control output current (i.e., flow of carriers in the channel) of a semiconducting device through electrical or magnetic fields. Each functional gate structure that is formed includes a gate material stack (not shown) of, from bottom to top, a gate dielectric portion and a gate conductor portion. In some embodiments, a gate cap portion (also not shown) can be present atop the gate conductor portion.

Each gate dielectric portion comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion.

The gate dielectric material used in providing the gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

Each gate conductor portion comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion may comprise an nFET gate metal. In other embodiments, the gate conductor portion may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, at least one sacrificial gate structure is formed first and then replaced with a functional gate structure. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional or sacrificial gate structure) source/drain regions (not) can be formed utilizing an epitaxial growth process from exposed portions of each semiconductor material fin that are not protected by a gate structure; the source/drain regions would by located within a plane that runs into and out of the drawings of the present application. The source/drain regions comprise any semiconductor material including, for example, silicon, silicon germanium alloys or III-V compound semiconductors. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure. The gate spacer can be formed by deposition of a gate spacer material, such as, for example, a dielectric oxide, and then etching the deposited gate spacer material by utilizing a spacer etch.

Figure 7:
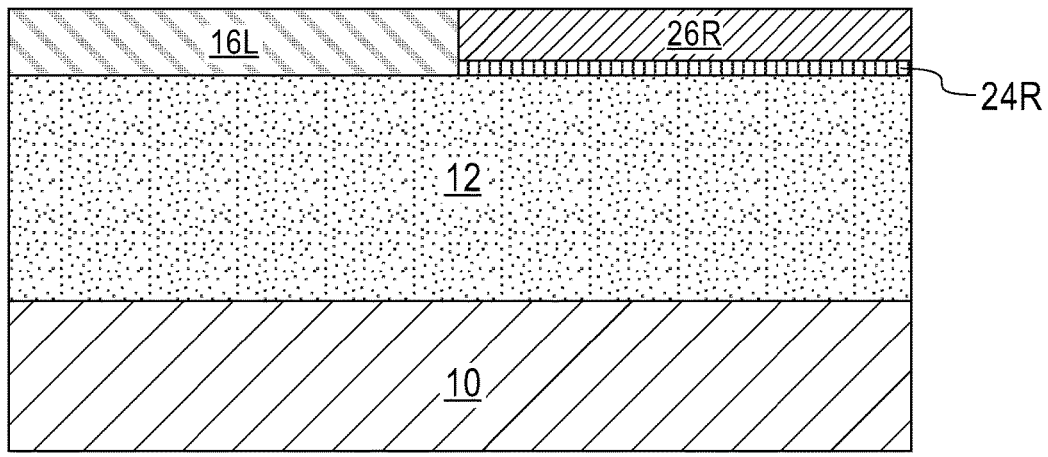
FIG. 7 is a cross sectional view of the exemplary semiconductor structure of FIG. 2 after forming, in any order, a boron-containing p-well region in a first region of the silicon germanium alloy layer that is doped with carbon, and an n-well region that contains, from bottom to top, an arsenic implant region and a phosphorus implant region in a second region of the silicon germanium alloy layer that is doped with carbon.

Referring now to FIG. 7, there is illustrated the exemplary semiconductor structure of FIG. 2 after forming, in any order, a boron-containing p-well region 16L in a first region of the carbon doped silicon germanium alloy layer 14, and an n-well region that contains, from bottom to top, an arsenic implant region 24R and a phosphorus implant region 26R in a second region of the carbon doped silicon germanium alloy layer 14. As is shown, a sidewall surface of the boron-containing p-well region 16L is in direct physical contact with a sidewall surface of the n-well region (24R, 26R). Collectively, the arsenic implant region 24R and the phosphorus-containing implant region 26R may be referred to as a phosphorus-containing n-well region.

Notably, FIG. 7 (and FIGS. 8-10 to follow) illustrates a semiconductor structure of the present application in which the diffusion of arsenic is retarded. The structure includes a strain relaxed silicon germanium alloy buffer layer 12 located on a surface of a silicon substrate 10. A boron-containing p-well region 16L is located in a first region of a carbon doped silicon germanium alloy layer 14 and on a first portion of the strain relaxed silicon germanium alloy buffer layer 12, and an n-well region containing an arsenic implant region 24R and a phosphorus implant region 26R is located is located in a second region of the carbon doped silicon germanium alloy layer 14 and on a second portion of the strain relaxed silicon germanium alloy buffer layer 12. A tensily strained silicon material 18 is located on a surface of the boron-containing p-well region 16L, and a compressively strained germanium-containing material 20 is located on a surface of the phosphorus-containing n-well region (i.e., the phosphorus implant region 26R).

In accordance with the present application, the boron p-well region 16L includes boron incorporated into the first region of the carbon doped silicon germanium alloy layer 14, while the n-well region includes phosphorus and arsenic co-incorporated into the second region of the carbon doped silicon germanium alloy layer 14. In this embodiment of the present application, boron and phosphorus diffusion is retarded since boron and phosphorus diffuse via vacancies. Carbon within the carbon doped silicon germanium alloy layer 14 takes up those vacancies and those retards the diffusion of boron and phosphorus. Also, and in this embodiment, arsenic diffusion is not a problem since it is located beneath the phosphorus implant region 26R and away from the subsequently formed semiconductor channel material, i.e., compressively strained germanium-containing material.

In some embodiments, the boron-containing p-well region 16L is formed prior to forming the n-well region (24R, 26R). In such an embodiment, a block mask is formed over the second region of the carbon doped silicon germanium alloy layer 14, while leaving the first region of the carbon doped silicon germanium alloy layer 14 exposed. The block mask may include a photoresist, a hard mask material or a material stack of, from bottom to top, a hard mask material, and a photoresist. The block mask can be formed utilizing techniques well known in the art. Boron is then implanted into the exposed first region of the carbon doped silicon germanium alloy layer 14 with the block mask in place utilizing ion implantation conditions that are well known to those skilled in the art. A diffusion anneal may follow the ion implantation of boron into the first region of the carbon doped silicon germanium alloy layer 14. After boron incorporation, the block mask located over the second region is removed and then another block mask is formed over the first region that now contains the boron-containing p-well region 16L. Phosphorus and arsenic are then co-implanted into the exposed second region of the carbon doped silicon germanium alloy layer 14 with the another block mask in place utilizing ion implantation conditions that are well known to those skilled in the art. A diffusion anneal may follow the co-implantation of phosphorus/arsenic into the second region of the carbon doped silicon germanium alloy layer 14. In some embodiments, a single diffusion anneal is used after co-introducing boron and phosphorus/arsenic into the respective regions of the carbon doped silicon germanium alloy layer 14. The another block mask is removed after the introduction of phosphorus into the second region of the carbon doped silicon germanium alloy layer 14.

In some embodiments, the n-well region (24R, 26R) is formed prior to forming the boron-containing p-well region 16L. In such an embodiment, the above steps of block mask formation and ion implantation is reversed.

In either embodiment, the boron-containing p-well region 16L may contain boron in a concentration of from $1\times10^{18}$ atoms/cm$^3$ to $1\times10^{19}$ atoms/cm$^3$, while the phosphorus implant region 26R may contain phosphorus in a concentration of from $1\times10^{18}$ atoms/cm$^3$ to $1\times10^{19}$ atoms/cm$^3$, and the arsenic implant region 24R may contain arsenic in a concentration of from $1\times10^{18}$ atoms/cm$^3$ to $1\times10^{19}$ atoms/cm$^3$.

Figure 8:
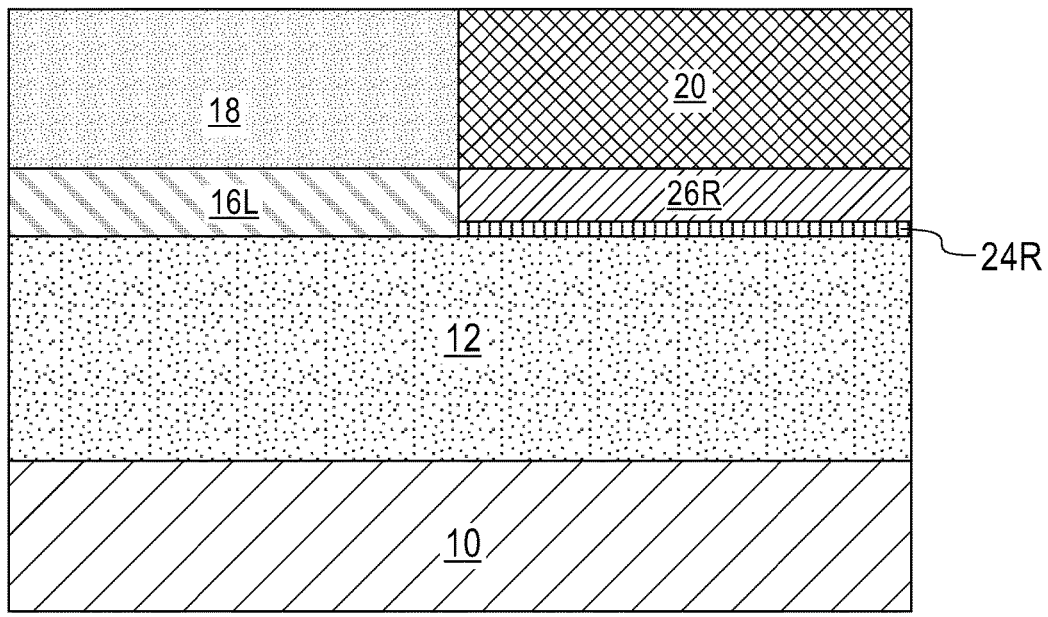
FIG. 8 is a cross sectional view of the exemplary semiconductor structure of FIG. 7 after forming, in any order, a tensily strained silicon layer on the boron-containing p-well region, and a compressively strained germanium-containing material layer on the n-well region.

Referring now to FIG. 8, there is illustrated the exemplary semiconductor structure of FIG. 7 after forming, in any order, a tensily strained silicon material 18 on the p-well region 16L, and a compressively-strained germanium-containing material 20 on the n-well region (24R, 26R). The tensily strained silicon material 18 and the compressively-strained germanium-containing material 20 may be formed as described above.

Figure 9:
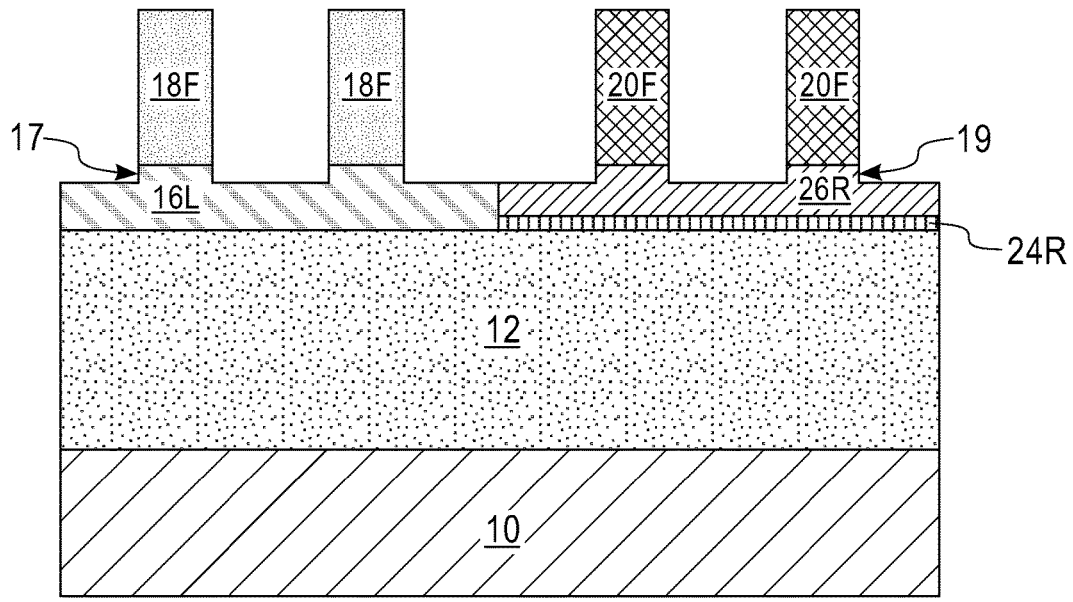
FIG. 9 is a cross sectional view of the exemplary semiconductor structure of FIG. 8 after patterning the tensily strained silicon layer and the compressively strained germanium-containing material layer to provide at least one tensily strained silicon fin and at least one compressively strained germanium-containing material fin, respectively.

Referring now to FIG. 9, there is illustrated the exemplary semiconductor structure of FIG. 8 after patterning the tensily strained silicon material 18 and the compressively-strained germanium-containing material 20 to provide at least one tensily strained silicon fin 18F and at least one compressively-strained germanium-containing material fin 20F, respectively. Patterning of the tensily strained silicon material 18 and the compressively-strained germanium-containing material 20 may include any of the techniques mentioned above in forming the semiconductor fins shown in FIG. 5 of the present application.

In some embodiments of the present application, and as shown, the etch used to define the semiconductor fins (18F, 20F) may remove exposed portions of the p-well region 16L and the n-well region (i.e., 26R, 24R). As is shown, each tensily strained silicon fin 18F is located on a mesa portion 17 of the p-well region 16L, and each compressively strained germanium-containing material fin 20F is located on a mesa portion 19 of the p-well region; notably the mesa portion is a raised portion of the phosphorus implant region 26R.

Figure 10:
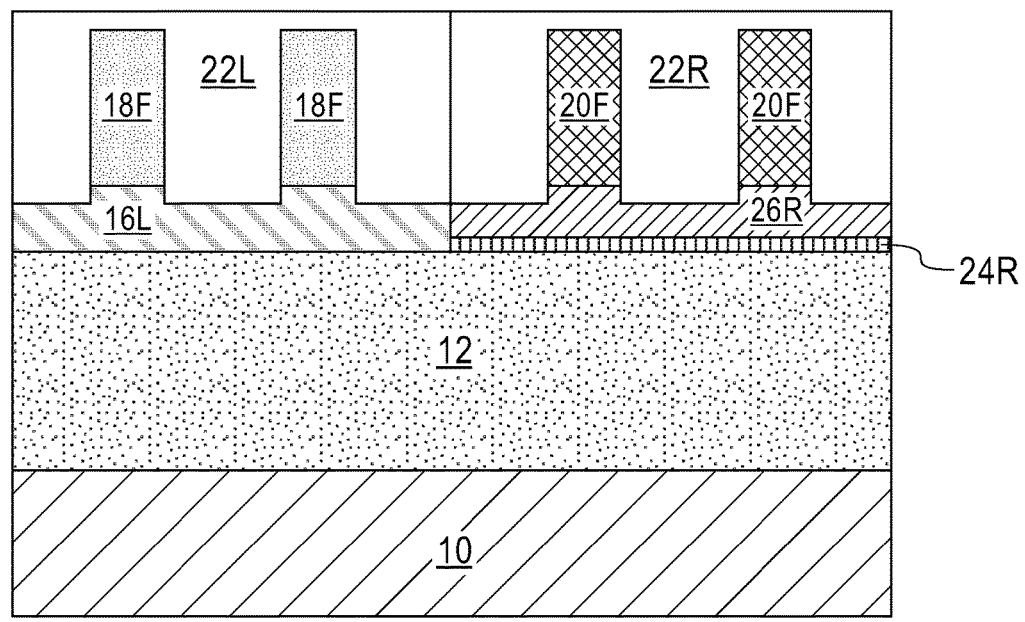
FIG. 10 is a cross sectional view of the exemplary semiconductor structure of FIG. 9 after forming a first functional gate structure straddling the at least one tensily strained silicon fin, and a second functional gate structure straddling the at least one compressively strained germanium-containing material fin.

Referring now to FIG. 10, there is illustrated the exemplary semiconductor structure of FIG. 9 after forming a first functional gate structure 22L straddling the at least one tensily strained silicon fin 18F, and a second functional gate structure 20R straddling the at least one compressively strained germanium-containing material fin 20F. The first and second functional gate structures of this embodiment are the same as those described above in forming the first and second functional gate structures shown in FIG. 6. In some embodiments, and as described above, a sacrificial gate structure may be formed prior to forming the functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a substrate comprising a strain relaxed silicon germanium alloy buffer layer located on a surface of a silicon substrate;
    a boron-containing p-well region located in a first region of a carbon doped silicon germanium alloy layer and on a first portion of said strain relaxed silicon germanium alloy buffer layer;
    a phosphorus-containing n-well region located in a second region of said carbon doped silicon germanium alloy layer and on a second portion of said strain relaxed silicon germanium alloy buffer layer;
    a tensily strained silicon material located on a surface of said boron-containing p-well region; and
    a compressively strained germanium-containing material located on a surface of phosphorus-containing n-well region.

2. The semiconductor structure of claim 1, wherein said compressively strained germanium-containing material comprises a silicon germanium alloy having a higher germanium content than said strain relaxed silicon germanium alloy buffer layer.

3. The semiconductor structure of claim 1, wherein said carbon doped silicon germanium alloy layer has a lattice constant that matches a lattice constant of said strain relaxed silicon germanium alloy buffer layer, and wherein said carbon doped silicon germanium alloy layer has a higher germanium content than said strain relaxed silicon germanium alloy buffer layer.

4. The semiconductor structure of claim 1, wherein said compressively strained germanium-containing material and said tensily strained silicon material have a same height.

5. The semiconductor structure of claim 1, wherein said phosphorus-containing n-well region is void of arsenic and antimony.

6. The semiconductor structure of claim 1, wherein said phosphorus-containing n-well region contains a lower region of arsenic and an upper region of phosphorus.

7. The semiconductor structure of claim 1, wherein a sidewall surface of said phosphorus-containing n-well region is in direct physical contact with a sidewall surface of said boron-containing p-well.

8. The semiconductor structure of claim 1, wherein said tensily strained silicon material comprises at least one silicon fin, and said compressively strained germanium-containing material comprises at least one germanium-containing material fin.

9. The semiconductor structure of claim 8, wherein said at least one silicon fin is located on a mesa portion of said boron-containing p-well region, and said at least one germanium-containing material fin is located on a mesa portion of said phosphorus-containing n-well region.

10. The semiconductor structure of claim 8, further comprising a first functional gate structure straddling said at least one silicon fin, and a second functional gate structure straddling said at least one germanium-containing material fin.

11. The semiconductor structure of claim 1, wherein said carbon doped silicon germanium alloy layer has an epitaxial relationship with said strain relaxed silicon germanium alloy buffer layer.

12. A method of forming a semiconductor structure, said method comprising:
    forming a substrate comprising a strain relaxed silicon germanium alloy buffer layer on a surface of a silicon substrate;
    forming a carbon doped silicon germanium alloy layer on a surface of said strain relaxed silicon germanium alloy buffer layer;
    forming, in any order, a boron-containing p-well region in a first region of said carbon doped silicon germanium alloy layer, and a phosphorus-containing n-well region in a second region of said carbon doped silicon germanium alloy layer; and forming, in any order, a tensily strained silicon material on a surface of said boron-containing p-well region, and a compressively strained germanium-containing material on said a surface of said phosphorus-containing n-well region.

13. The method of claim 12, wherein said forming said boron-containing p-well comprises introducing boron into said first region of said carbon doped silicon germanium alloy layer, and said forming said phosphorus-containing n-well region comprises introducing phosphorus into said second region of said carbon doped silicon germanium alloy layer.

14. The method of claim 12, wherein said forming said boron-containing p-well comprises introducing boron into said first region of said carbon doped silicon germanium alloy layer, and said forming said phosphorus-containing n-well region comprises co-introducing phosphorus and arsenic into said second region of said carbon doped silicon germanium alloy layer, wherein said arsenic is introduced deeper than said phosphorus.

15. The method of claim 12, wherein said carbon doped silicon germanium alloy layer has a lattice constant that matches a lattice constant of said strain relaxed silicon germanium alloy buffer layer, and wherein said carbon doped silicon germanium alloy layer has a higher germanium content than said strain relaxed silicon germanium alloy buffer layer.

16. The method of claim 12, wherein said compressively strained germanium-containing material comprises a silicon germanium alloy having a higher germanium content than said strain relaxed silicon germanium alloy buffer layer.

17. The method of claim 12, wherein said compressively strained germanium-containing material and said tensily strained silicon material have a same height.

18. The method of claim 12, further comprising patterning said tensily strained silicon material to provide a least one silicon fin, and said compressively strained germanium-containing material to provide a least one compressively strained germanium-containing material fin.

19. The method of claim 18, wherein during said patterning, a portion of said boron-containing p-well region is removed to provide a mesa portion of said boron-containing p-well region, and a portion of said phosphorus-containing n-well region is removed to provide a mesa portion of said phosphorus-containing n-well region.

20. The method of claim 18, further comprising forming a first functional gate structure straddling said at least one silicon fin, and a second functional gate structure straddling said at least one germanium-containing material fin.

* * * * *